United States Patent [19]

Nakahara

[11] Patent Number: 5,075,242
[45] Date of Patent: Dec. 24, 1991

[54] METHOD OF MANUFACTURING CMOS SEMICONDUCTOR DEVICE HAVING DECREASED DIFFUSION LAYER CAPACITANCE

[75] Inventor: Moriya Nakahara, Yokohama, Japan

[73] Assignee: Kabushiki Kaisha Toshiba, Kawasaki, Japan

[21] Appl. No.: 450,570

[22] Filed: Dec. 14, 1989

[30] Foreign Application Priority Data

Dec. 19, 1988 [JP] Japan .................................. 63-318637

[51] Int. Cl.$^5$ .......................................... H01L 21/265
[52] U.S. Cl. ....................................... 437/34; 437/40; 437/45; 437/57; 357/44
[58] Field of Search ..................... 437/34, 56, 57, 34, 437/, 45, 40; 357/44

[56] References Cited

U.S. PATENT DOCUMENTS 4,530,150  6/1985  Shirato ................................... 437/34
4,553,315  11/1985  McCarty ................................ 437/34
4,697,148  9/1987  Komori et al. ...................... 357/23.12
5,021,356  6/1991  Henderson et al. ................. 437/45

Primary Examiner—Olik Chaudhuri
Assistant Examiner—Long Pham
Attorney, Agent, or Firm—Finnegan, Henderson, Farabow, Garrett, and Dunner

[57] ABSTRACT

A method of manufacturing a CMOS semiconductor device includes the step of preparing a substrate having a first region of a second conductivity type serving as prospective source and drain formation regions of a transistor of a first conductivity type, and a second region of the first conductivity type serving as a prospective channel formation region of a transistor of the second conductivity type. The method of manufacturing the device further includes the steps of simultaneously doping an impurity of the first conductivity type having a first concentration in a first depth of each of the first and second regions, and doping an impurity of the first conductivity type having a concentration higher than the first concentration in a second depth smaller than the first depth of the first region.

15 Claims, 4 Drawing Sheets

METHOD OF MANUFACTURING CMOS SEMICONDUCTOR DEVICE HAVING DECREASED DIFFUSION LAYER CAPACITANCE

BACKGROUND OF THE INVENTION

1. Field of the Invention

The present invention relates to a method of manufacturing a semiconductor device and, more particularly, to a method of manufacturing a CMOS semiconductor device.

2. Description of the Related Art

In the manufacture of a semiconductor device such as a CMOS device, a tendency toward further micro-patterning and higher density of the circuit is prominent. In this case, a so-called scaling rule law is applied, and the concentrations of a substrate, a well, and a diffusion layer tend to be increased with the tendency toward further micropatterning and higher density of the circuit.

Several factors are assumed to determine an operation speed of a device. In particular, in a logic device, a capacitance of a diffusion layer defined by a depletion layer formed in a p-n junction between a diffusion region and a substrate, or between a diffusion region and a well is a major factor. More specifically, when a capacitance of a diffusion layer is increased, a speed of the device is decreased. In general, when the concentrations of a substrate and a well near p-n junctions are increased, the width of the depletion layer is decreased, thereby increasing a capacitance of the diffusion layer. Therefore, with the tendency toward further micropatterning and higher density of the circuit, a speed of the device is undesirably reduced.

If the concentration of the substrate is increased, an electric field applied to the depletion layer of a p-n junction becomes high, and hence probability of generation of a so-called hot carrier is increased, thus causing degradation in reliability of the device.

When the circuit is micropatterned, the depth of the diffusion layer is decreased. In this case, a metal wiring layer undesirably penetrates into the substrate from the diffusion layer. Thus, in a conventional method of manufacturing a CMOS semiconductor device, when an attempt is made to micropattern and increase the density of the circuit, a speed of the device may be reduced, or a metal wiring layer may penetrate into the substrate from the diffusion layer.

SUMMARY OF THE INVENTION

It is, therefore, an object of the present invention to provide a method of manufacturing a high-speed CMOS semiconductor device, in which a capacitance of a diffusion layer is decreased and a depth of the diffusion layer is increased, so that a metal wiring layer does not penetrate into a substrate from the diffusion layer.

DETAILED DESCRIPTION OF THE PREFERRED EMBODIMENTS

Problems of a conventional method of manufacturing a CMOS semiconductor device will be described hereinafter in detail.

In general, in a semiconductor device, a capacitance C per unit area of a depletion layer formed at a p-n junction between a diffusion region and a well, or between a diffusion region and a substrate is given by:

$$C = \epsilon/w \tag{1}$$

where $\epsilon$ is the permittivity, and $w$ is the width of a depletion layer. The width of the depletion layer is defined as:

$$w = \sqrt{\frac{2\epsilon}{q}\left(\frac{1}{N_A} + \frac{1}{N_D}\right)\phi_T} \tag{2}$$

where q is the elementary electric charge, $N_A$ is the concentration of an acceptor, $N_D$ is the concentration of a donor, and $\phi_T$ is the total potential applied to the depletion layer.

Therefore, when a substrate or well concentration near a p-n junction, or an acceptor or donor concentration $N_A$ or $N_D$ corresponding to a concentration of a diffusion layer is increased, extension of the width w of a depletion layer is suppressed, as defined in equation (2). When the width w of a depletion layer is decreased, as defined in equation (1), a capacitance of the diffusion layer is increased, thus reducing an operation speed of the integrated circuit.

When a substrate concentration is increased, a breakdown voltage of a p-n junction is reduced, or when an electric field applied to a depletion layer generated at the p-n junction becomes high, probability of generation of a hot carrier is increased, thus causing degradation in reliability of the device.

In addition, with the miniaturization of a device, the depth of a diffusion layer is decreased. Therefore, a metal wiring layer, which is formed in the following step, undesirably penetrates into a substrate from the diffusion layer.

Thus, in a method of manufacturing a CMOS semiconductor device according to prior art, with the tendency toward further micropatterning and higher density of the integrated circuits, an operation speed of the integrated circuits is reduced, and a metal wiring layer undesirably penetrates into a substrate from a diffusion layer.

The present invention, therefore, has been made to solve the above problems.

A method of manufacturing a CMOS semiconductor device according to an embodiment of the present invention will be described hereinafter with reference to FIGS. 1 to 3.

FIGS. 1A to 1E are sectional views showing a method of manufacturing a CMOS semiconductor device according to an embodiment of the present invention in the order of the manufacturing steps.

Figure 1A:
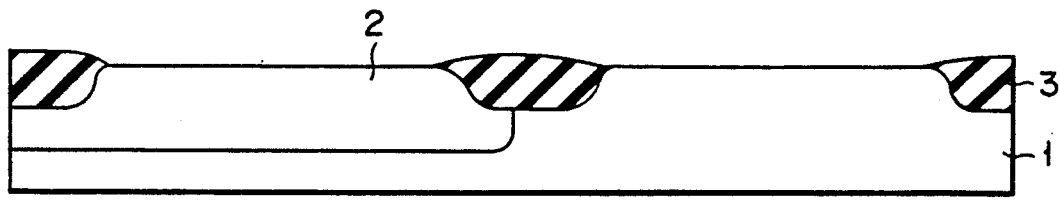
FIGS. 1A to 1E are sectional views showing a method of manufacturing a CMOS semiconductor device according to an embodiment of the present invention in an order of manufacturing steps.

A p-type impurity, e.g., boron, is selectively ion-implanted in an n-type semiconductor substrate 1 to form a p-type well region 2. Thereafter, field oxidation is performed to form a field oxide film 3 (FIG. 1A).

A gate oxide film 4 is formed on the n-type semi-conductor substrate 1 and the p-type well region 2 by thermal oxidation to have a thickness of, e.g., 200 Å. Thereafter, a resist 5 having openings is formed on the oxide films 3 and 4 in order to form a channel region of an n-channel transistor and source and drain regions of a p-channel transistor.

Note that the resist 5 in this case is formed not only on a prospective channel formation region, but to extend on the source by a distance substantially corresponding to a depth $X_{jN}$, e.g., about 0.5 to 1.5 μm, of source and drain diffusion layers of the n-channel transistor (to be described later). The resist 5 also extends on the drain by a distance substantially corresponding to the depth $X_{jN}$. Then, using the resist 5 as a mask, impurities are simultaneously ion-implanted in the prospective channel formation region of the n-channel transistor and prospective source and drain formation regions of the p-channel transistor. A method of ion-implantation is as follows. First, in order to control a threshold voltage of the n-channel transistor, boron is ion-implanted in shallow positions 6 and 6' each having a depth of, e.g., about 0.1 μm from a surface at an accelerated energy of 40 keV and a dose of $3 \times 10^{12}$ ions/cm$^2$. Then, in order to prevent punch through of the n-channel transistor, and to form a low-concentration p$^-$ diffusion layer in the prospective source and drain formation regions of the p-channel transistor, boron is ion-implanted in deep positions 7 and 7' each having a depth of, e.g., about 0.25 μm from the surface at an accelerated energy of 80 keV and a dose of $2 \times 10^{12}$ ions/cm$^2$. As described above, since the resist is formed to extend on the prospective source and drain formation regions from the prospective channel formation region, the source and drain regions in which the impurity is ion-implanted are formed at positions each spaced apart from the channel region by a distance substantially corresponding to the depth $X_{jN}$ of the source and drain diffusion layers of the n-channel transistor (to be described later). Thereafter, the resist 5 is etched (FIG. 1B).

Figure 1B:
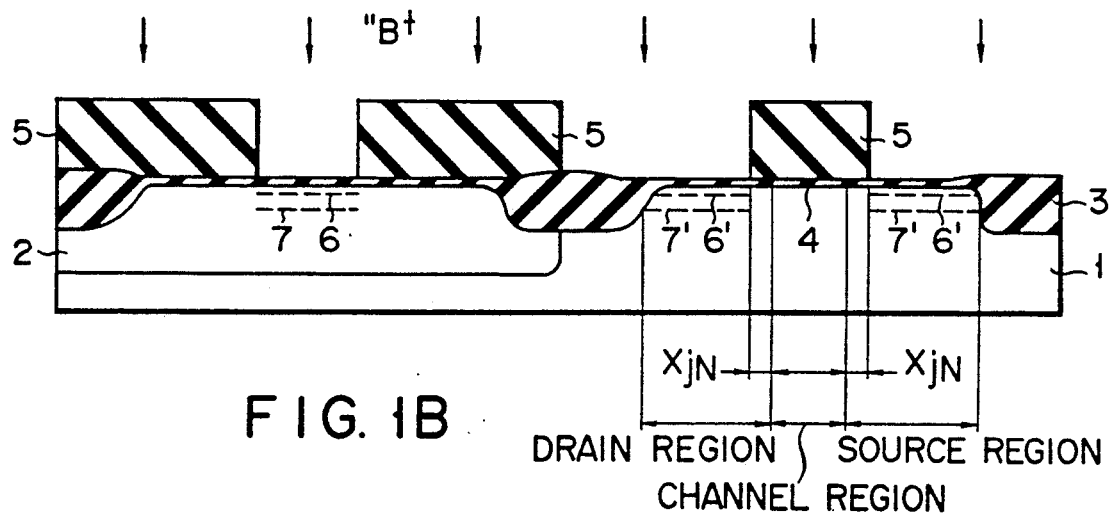
Figure 1C:
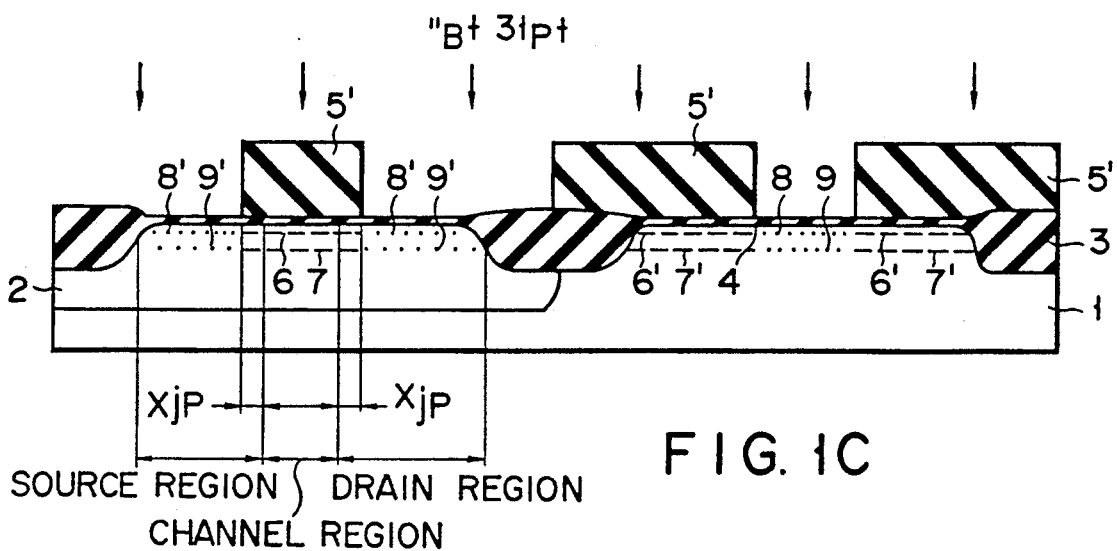

In the same manner as in FIG. 1B, a resist 5' having openings is formed on the oxide films 3 and 4 in order to form a channel region of the p-channel transistor and source and drain regions of the n-channel transistor. Note that the resist 5' in this case is formed to extend on the source from the channel region by a distance substantially corresponding to a depth $X_{jP}$ of the source and drain diffusion layers of the p-channel transistor (to be described later) in the same manner as in the above-mentioned resist 5. The resist 5' also extends on the drain by a distance substantially corresponding to the depth $X_{jP}$. Then, using the resist 5' as a mask, impurities are simultaneously ion-implanted in the prospective channel formation region of the p-channel transistor and the prospective source and drain formation regions of the n-channel transistor. A method of ion-implantation is as follows. First, in order to control a threshold voltage of the p-channel transistor, boron is ion-implanted in shallow positions 8 and 8' each having a depth of, e.g., about 0.1 μm from the surface at an accelerated energy of 40 keV and a dose of $3 \times 10^{12}$ ions/cm$^2$. Then, in order to prevent punch through of the p-channel transistor, and to form a low-concentration n$^-$ diffusion layer in the prospective source and drain formation regions of the n-channel transistor, phosphorus is ion-implanted in deep positions 9 and 9' each having a depth of, e.g., about 0.25 μm from the surface at an accelerated energy of 240 keV and a dose of $6 \times 10^{12}$ ions/cm$^2$. As described above, since the resist is formed to extend on the prospective source and drain formation regions from the prospective channel formation region, the source and drain regions in which the impurity is ion-implanted are formed at positions each spaced apart from the channel region by a distance substantially corresponding to the depth $X_{jP}$ of the source and drain diffusion layers of the p-channel transistor (to be described later). Thereafter, the resist 5' is etched (FIG. 1C).

Thereafter, an n$^+$-type polysilicon gate electrode 10 is formed on the channel regions of the n- and p-channel transistors by, e.g., polysilicon CVD, POCl$_3$ diffusion, lithography, or reactive ion etching (RIE). Then, using the gate electrode 10 and the oxide film 3 as masks, arsenic is ion-implanted in the prospective source and drain formation regions of the n-channel transistor at an accelerated energy of 40 keV and a dose of $5 \times 10^{15}$ ions/cm$^2$.

Figure 1D:
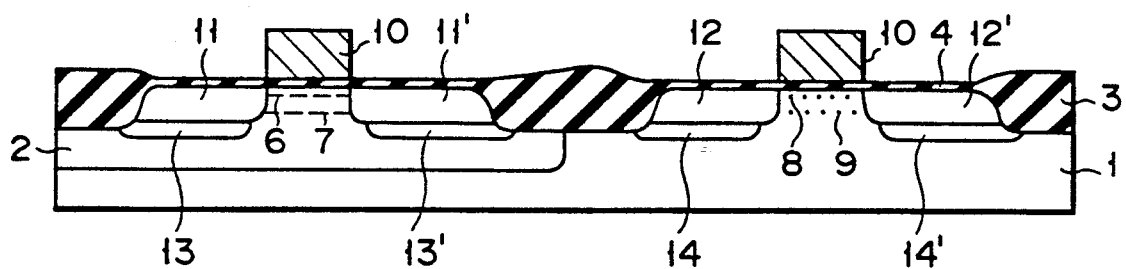

Similarly, boron is ion-implanted in the prospective source and drain formation regions of the p-channel transistor at an accelerated energy of 40 keV and a dose of $5 \times 10^{15}$ ions/cm$^2$. Thereafter, high-temperature annealing is performed to form diffusion layers 11 and 11' serving as the source and drain regions of the n-channel transistor, and diffusion layers 12 and 12' serving as the source and drain regions of the p-channel transistors. As described above, impurities are simultaneously ion-implanted in the channel and the source and drain regions. Therefore, low-concentration (about $10^{17}$ atoms/cm$^3$) n$^-$ diffusion layers 13 and 13' are formed under the diffusion layers 11 and 11' serving as the source and drain regions of the n-channel transistor, respectively. Similarly, low-concentration (about $10^{17}$ atoms/cm$^3$) p$^-$ diffusion layers 14 and 14' are formed under the diffusion layers 12 and 12' serving as the source and drain regions of the p-channel transistor, respectively (FIG. 1D).

An interlayer insulating film 15 is formed on the entire surface of the oxide films 3 and 4, and the gate electrode 10 by, e.g., chemical vapor deposition (CVD). Then, a boron-doped phospho-silicate glass (BPSG) 16 is formed on the insulating film 15.

Figure 1E:
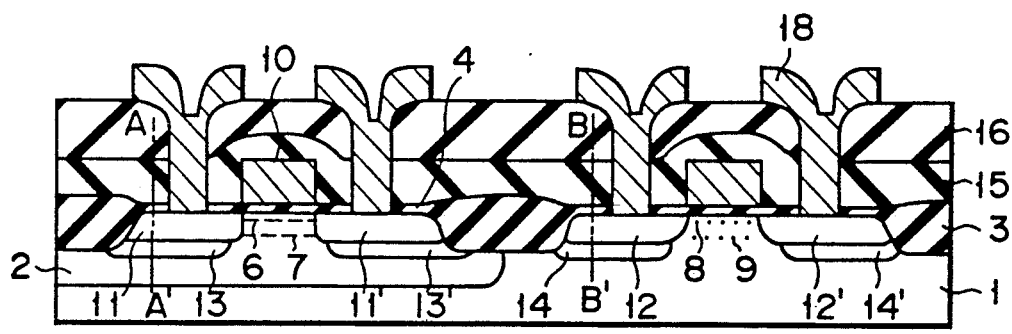

Thereafter, the insulating films 4, 15, and 16 on the source and drain regions 11, 11', 12, and 12' are removed, and a wiring material such as aluminum is deposited on the exposed p$^+$ diffusion layers 11 and 11' and n$^+$ diffusion layers 12 and 12' by, e.g., sputtering, thus forming a wiring layer 18 (FIG. 1E).

Figure 2A:
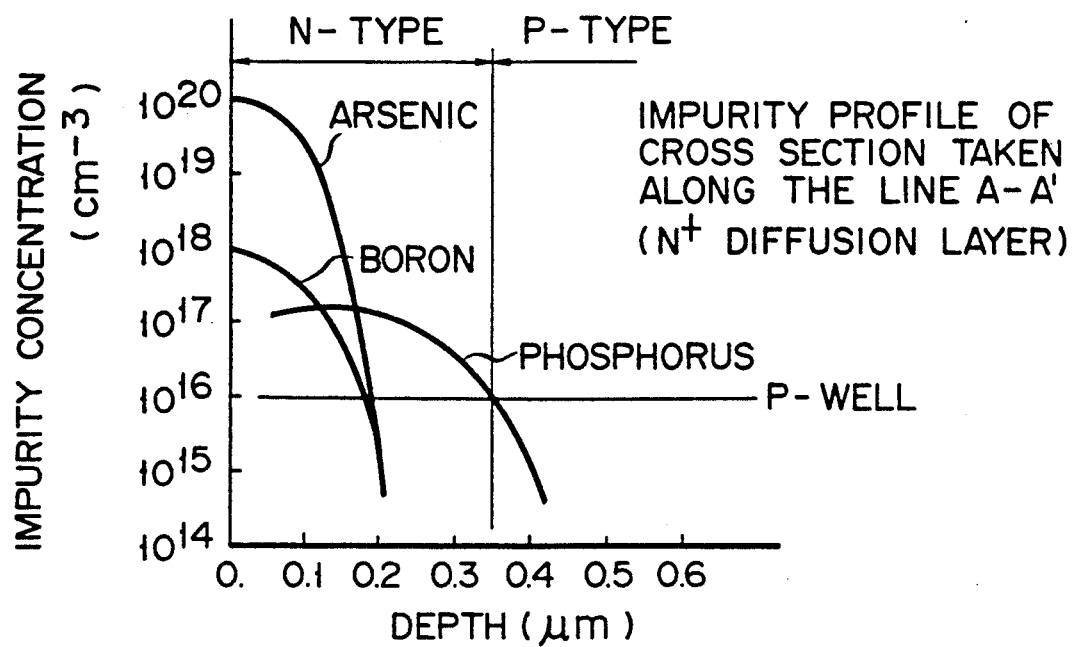
FIGS. 2A and 2B are graphs showing an impurity profile of each diffusion layer of the CMOS semiconductor device shown in FIG. 1E.
Figure 2B:
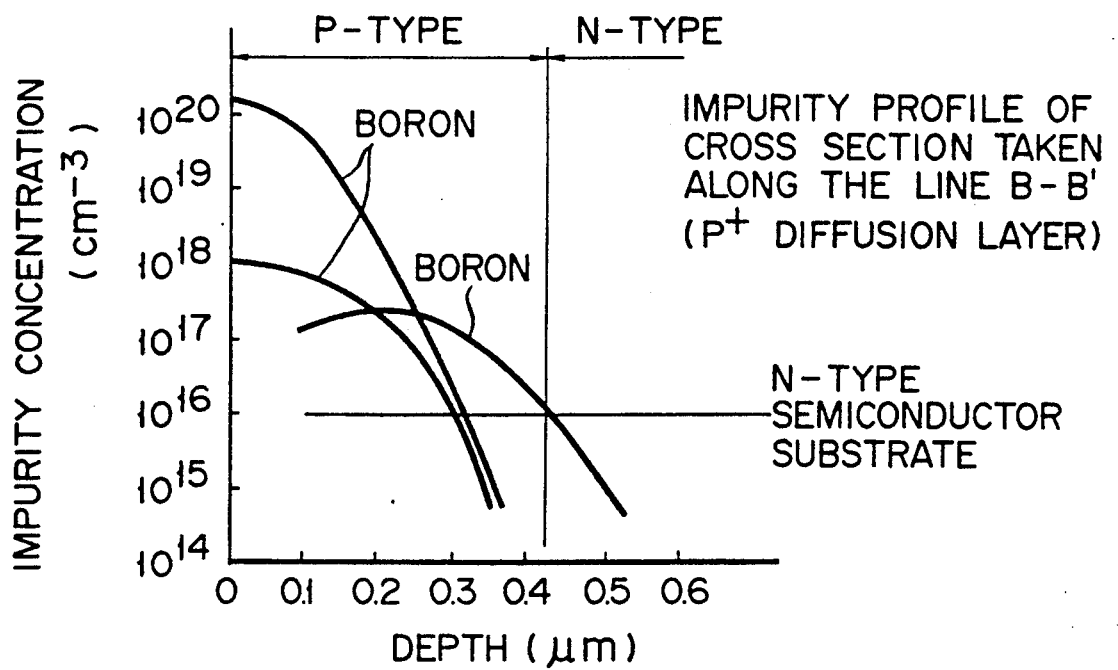
Figure 4:
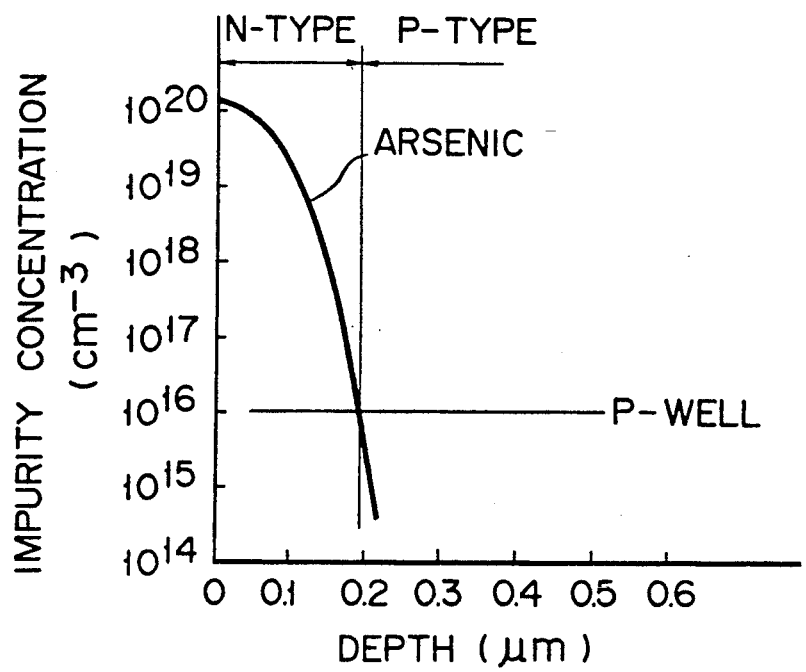
FIG. 4 is a graph showing an impurity profile of a diffusion layer in a conventional CMOS semiconductor device.

FIGS. 2A and 2B are graphs showing impurity profiles in cross sections obtained by taking the CMOS semiconductor device formed by the above manufacturing method along the lines A - A' and B - B' in FIG. 1E. In FIGS. 2A and 2B, the axis of abscissa represents a depth (μm) of the diffusion layer from the surface of the substrate 1, and the axis of ordinate represents an impurity concentration (cm$^{-3}$) at each depth. FIG. 2A shows an impurity profile of the source and drain regions (a cross section taken along the line of A - A') of the n-channel transistor. The profile in FIG. 2A is compared with an impurity profile of the source and drain regions of the n-channel transistor obtained by a manufacturing method according to a prior art shown in FIG. 4. In FIG. 2A corresponding to the embodiment of the present invention, an impurity concentration of a portion near a junction (an alternate long and short dash line in FIG. 2A) between a diffusion layer and a well is simultaneously decreased by ion-implantation of phosphorus in a deep position at the same time as ion-implantation for preventing punch through of the p-channel transistor. When the impurity concentration of a portion on the diffusion layer side near the junction between the diffusion layer and the substrate is decreased, extension of the depletion layer on the diffusion layer side is increased, as defined in equation (2). When extension of the depletion layer is increased, a capacitance of the diffusion layer is decreased, as defined in equation (1). FIG. 2B shows an impurity profile of the source and drain regions (a cross section taken along the line of B - B') of the p-channel transistor. Since boron is ion-implanted in the deep position at the same time as ion-implantation for preventing punch through of the n-channel transistor, the same effect as described above is obtained.

Note that the impurity concentration of boron, ion-implanted in the shallow positions 6, 6', 8, and 8' in order to control the threshold voltage, is 1/100 that of the diffusion layer. Therefore, boron ion-implanted in the shallow positions does not affect the characteristics of the present invention.

Figure 3:
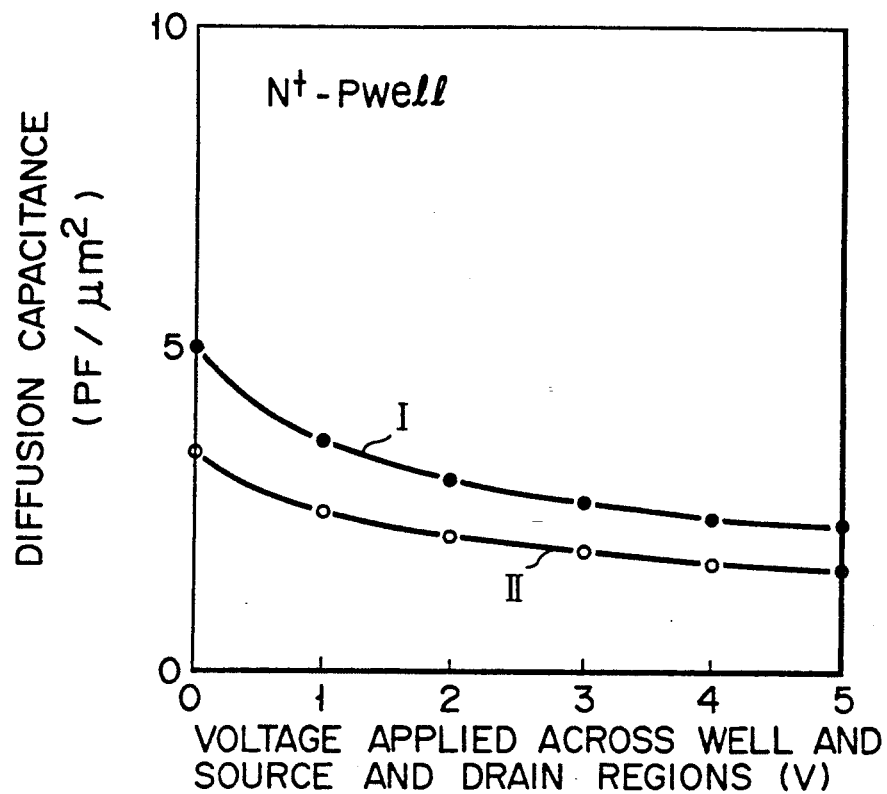
FIG. 3 is a graph obtained when a capacitance of a diffusion layer of the CMOS semiconductor device shown in FIG. 1E is measured in practice.

FIG. 3 is a graph obtained when a voltage (V) applied across a well and source and drain regions is changed, and a diffusion capacitance of a p-n junction between a P-well formed on the n-type substrate and the source and drain of the n-channel transistor formed above the p-well is measured in practice. This measurement is performed under two conditions. That is, a case wherein the above-mentioned manufacturing method according to the present invention is employed, and a case wherein a manufacturing method according to the prior art is employed. Note that, in the prior art (a curve I), boron is ion-implanted at an accelerated energy of 100 keV and a dose of $8 \times 10^{12}$ ions/cm$^2$ to form the P-well, and arsenic is ion-implanted at an accelerated energy of 50 keV and a dose of $5 \times 10^{15}$ ions/cm$^2$ to form the n+-type layers of the $5 \times 10^{15}$ ions/cm$^2$ to form the n+-type layers of the source and drain. In the present invention (a curve II), boron is ion-implanted at an accelerated energy of 100 keV and a dose of $8 \times 10^{12}$ ions/cm$^2$ to form the P-well. Arsenic is ion-implanted at an accelerated energy of 50 keV and a dose of $5 \times 10^{15}$ ions/cm$^2$ to form the n+-type layers of the source and drain. Phosphorus is ion-implanted at an accelerated energy of 240 keV and a dose of $3 \times 10^{12}$ ions/cm$^2$ to form the n−-type layers at the bottoms of the source and drain.

In FIG. 3, when a diffusion capacitance of a p-n junction between the P-well and the source and drain of the n-channel transistor according to the prior art is compared with that according to the present invention, the diffusion capacitance in the present invention is smaller than that in the prior art. For example, when an application voltage is 5 (V), the diffusion capacitance of the present invention is decreased from that of the prior art by about 24%.

Thus, when the above-mentioned method of manufacturing a CMOS semiconductor device is employed, an impurity concentration of a portion near a junction between the source and drain diffusion layers and the substrate or the well can be decreased as follows. When an impurity is ion-implanted in a deep position of a channel region of one transistor, an impurity is simultaneously ion-implanted in source and drain regions of the other transistor. Therefore, a low-concentration diffusion layer can be formed under the source and drain diffusion layers according to the prior art without increasing the number of manufacturing steps. Therefore, an impurity concentration of a portion on the diffusion layer side near the junction between the source and drain diffusion layers and the substrate or the well can be decreased. More specifically, when the impurity concentration is decreased, extension of a depletion layer on the diffusion layers as well as the substrate or the well is increased and its total extension is increased accordingly, and a capacitance of the diffusion layer can be decreased, thereby realizing a high-speed operation of the CMOS semiconductor device.

When the above-mentioned ion-implantation is performed, a low-concentration diffusion layer can be formed under the diffusion layer according to the present invention. Therefore, the depths of the source and drain diffusion layers are increased, a metal wiring layer causes almost no penetration into the substrate or the well. In addition, the above-mentioned ion-implantation is performed with respect to the source and drain regions spaced apart from the channel region by a distance substantially corresponding to the depth $X_{jP}$ or $X_{jN}$ of the source and drain diffusion layers. Therefore, the low-concentration diffusion layer formed under the diffusion layer according to the present invention is formed in a region spaced apart from the channel region by a distance substantially corresponding to the depth $X_{jP}$ or $X_{jN}$ of the source and drain diffusion layers. In other words, since only the diffusion layer according to the present invention is formed near the channel region, a decrease in threshold voltage due to a short-channel effect caused by an increase in depths of the source and drain diffusion layers does not occur.

As described above in detail, a low-concentration diffusion layer can be formed under the diffusion layer according to the present invention without increasing the number of manufacturing steps. For this reason, an impurity concentration of a portion on the diffusion layer side near the junction between the source and drain diffusion layers and the substrate or the well can be reduced, and a capacitance of the diffusion layer can be decreased, thereby achieving a high-speed operation. In addition, since the depths of the source and drain diffusion layers are increased, there is provided a method of manufacturing a CMOS semiconductor device in which a metal wiring layer causes almost no penetration into the substrate or the well.

What is claimed is:

1. A method of manufacturing a CMOS semiconductor device, comprising the steps of:
preparing a substrate having a first region of a second conductivity type serving as prospective source and drain formation regions of a transistor of a first conductivity type, and a second region of the first conductivity type serving as a prospective channel formation region of a transistor of the second conductivity type;
simultaneously doping an impurity of the first conductivity type having a first concentration in a first depth of each of said first and second regions; and
doping an impurity of the first conductivity type having a concentration higher than the first concentration in a second depth smaller than the first depth of said first region.

2. A method according to claim 1, wherein the first depth is about 0.25 μm from a portion near a surface.

3. A method according to claim 1, wherein the second depth is about 0.1 μm from a portion near the surface.

4. A method according to claim 1, wherein the step of doping the impurity of the first conductivity type having the first concentration includes the step of ion-implanting boron in the second depth at a accelerated energy of 40 keV and a dose of $3 \times 10^{12}$ ions/cm$^2$.

5. A method according to claim 1, wherein the step of doping the impurity of the first conductivity type having the higher concentration includes the step of ion-implanting boron in the first depth at an accelerated energy of 80 keV and a dose of $2 \times 10^{12}$ ions/cm$^2$.

6. A method according to claim 1, wherein the step of doping the impurity of the first conductivity type having the higher concentration includes the step of ion-implanting phosphorus in the first depth at an accelerated energy of 240 keV and a dose of $6 \times 10^{12}$ ions/cm$^2$.

7. A method of manufacturing a CMOS semiconductor device, comprising the steps of:
preparing a substrate having a first region of a second conductivity type serving as prospective source and drain formation regions of a transistor of a first conductivity type, a second region of the second conductivity type serving as a prospective channel formation region of the transistor of the first conductivity type, a third region of the first conductivity type serving as prospective source and drain formation regions of a transistor of the second conductivity type, and a fourth region of the first conductivity type serving as a prospective channel formation region of the transistor of the second conductivity type;
simultaneously doping an impurity of the first conductivity type having a first concentration in a first depth of each of said first and fourth regions;
doping an impurity of the first conductivity type having a concentration higher than the first concentration in a second depth smaller than the first depth of said first region;
simultaneously doping an impurity of the second conductivity type having a second concentration in a third depth of each of said second and third regions; and
doping an impurity of the second conductivity type having a concentration higher than the second concentration in a fourth depth smaller than the third depth of said third region.

8. A method according to claim 7, wherein the first depth is about 0.25 μm from a portion near a surface.

9. A method according to claim 7, wherein the second depth is about 0.1 μm from a portion near the surface.

10. A method according to claim 7, wherein the step of doping the impurity of the first conductivity type having the first concentration includes the step of ion-implanting boron at an accelerated energy of 40 keV and a dose of $3 \times 10^{12}$ ions/cm$^2$.

11. A method according to claim 7, wherein the step of doping the impurity of the first conductivity type having the higher concentration includes the step of ion-implanting boron at an accelerated energy of 80 keV and a dose of $2 \times 10^{12}$ ions/cm$^2$.

12. A method according to claim 7, wherein the step of doping the impurity of the first conductivity type having the higher concentration includes the step of ion-implanting phosphorus at an accelerated voltage of 240 keV a dose of $6 \times 10^{12}$ ions/cm$^2$.

13. A method of manufacturing a CMOS semiconductor device, comprising the steps of:
preparing a substrate having a first region of a second conductivity type serving as prospective source and drain formation regions of a transistor of a first conductivity type, a second region of the second conductivity type serving as a prospective channel formation region of the transistor of the first conductivity type, and a third region of the first conductivity type serving as a prospective channel formation region of the transistor of the second conductivity type;
simultaneously doping an impurity of the first conductivity type having a first concentration in a first depth of each of said first region spaced apart from said second region by a predetermined distance and said third region; and
doping an impurity of the first conductivity type having a concentration higher than the first concentration in a second depth smaller than the first depth of said first region.

14. A method according to claim 13, wherein the predetermined distance falls within the range of about 0.5 to 1.5 μm.

15. A method according to claim 13, wherein the predetermined distance is substantially equal to the depths of said prospective source and drain formation regions.

* * * * *

UNITED STATES PATENT AND TRADEMARK OFFICE
CERTIFICATE OF CORRECTION

PATENT NO. : 5,075,242
DATED : December 24, 1991
INVENTOR(S) : Moriya Nakahara

It is certified that error appears in the above-identified patent and that said Letters Patent is hereby corrected as shown below:

Claim 4, column 7, line 11, after "at" change "a" to --an--.

Claim 12, column 8, line 22, after "keV" insert --and--.

Signed and Sealed this

Twenty-ninth Day of June, 1993

Attest:

MICHAEL K. KIRK

Attesting Officer     Acting Commissioner of Patents and Trademarks